United States Patent [19]
Douglas et al.

[11] Patent Number: 5,482,564
[45] Date of Patent: Jan. 9, 1996

[54] METHOD OF UNSTICKING COMPONENTS OF MICRO-MECHANICAL DEVICES

[75] Inventors: Monte A. Douglas, Coppell; Robert M. Wallace, Dallas, both of Tex.

[73] Assignee: Texas Instruments Incorporated, Dallas, Tex.

[21] Appl. No.: 263,292

[22] Filed: Jun. 21, 1994

[51] Int. Cl.$^6$ .............................. B08B 3/04; B08B 5/04; B08B 7/00
[52] U.S. Cl. .............................. 134/18; 134/19; 134/26; 134/37; 134/40; 134/21
[58] Field of Search .............................. 134/18, 42, 26, 134/19, 37, 7, 21, 40; 156/344

[56] References Cited

U.S. PATENT DOCUMENTS 5,302,212  4/1994  Desbiendras et al. ............ 134/42

OTHER PUBLICATIONS

Edward Bok, Dieter Kelch, Kevin S. Schumacher, "Supercritical Fluids for Single Wafer Cleaning", *Solid State Technology*, Jun. 1992, pp. 117–120.
W. Dale Spall, "Supercritical Carbon Dioxide Precision Cleaning for Solvent and Waste Reduction", *International Journal of Environmentally Conscious Design & Manufacturing*, vol. 2, No. 1, 1993, pp. 81–86.
R. L. Alley, C. J. Cuan, R. T. Howe, and K. Komvopoulos (Alley et al.), "The Effect of Release–Etch Processing on Surface Microstructure Stiction", *IEEE, 1992, pp. 202–207*.
Theresa A. Core, W. K. Tsang, Steven J. Sherman, "Fabrication Technology for an Integrated Surface–Micromachined Sensor", *Solid State Technology*, Oct. 1993, pp. 34–47.
Gregory T. Mulhern, David S. Soane, and Roger T. Howe, "Supercritical Carbon Dioxide Drying of Microstructures", *International Conference on Solid State Sensors and Actuators*, 1993, pp. 296–299.

*Primary Examiner*—Jan H. Silbaugh
*Assistant Examiner*—Zeinab El-Arini
*Attorney, Agent, or Firm*—Julie L. Reed; Richard L. Donaldson; Rene E. Grossman

[57] ABSTRACT

A method of unsticking contacting elements (11, 17) of a micro-mechanical device (30). The device is exposed to either a low surface tension liquid with a surfactant (32) or to a supercritical fluid (62) so as to avoid damage to fragile components of the device (30). The exposure conditions are controlled so as to provide optimum results without damage to the device.

20 Claims, 2 Drawing Sheets

METHOD OF UNSTICKING COMPONENTS OF MICRO-MECHANICAL DEVICES

TECHNICAL FIELD OF THE INVENTION

This invention relates to micro-mechanical devices, and more particularly, to micro-mechanical devices having contacting elements and of treating such devices after their contacting elements have become stuck together.

BACKGROUND OF THE INVENTION

A recent development in the field of electro-mechanics has been the miniaturization of various mechanical devices. Typical of such devices are tiny motors, gears, levers, and valves. These "micro-mechanical" devices are manufactured using integrated circuit techniques, often together with electrical control circuitry. Common applications include accelerometers, pressure sensors, and actuators. As another example, micro-mirrors can be configured for use in spatial light modulators.

Reliability has been difficult to achieve with micro-mechanical devices. A common reliability problem is sticking, which occurs when the device has a moving element that contacts another surface of the device. The moving element may become stuck against that surface, causing the device to cease to operate properly. A related problem is that repeated contact between elements can cause their surfaces to wear.

Because of the tiny dimensions of micro-mechanical devices, the cause of sticking and the effects of various attempts to solve the sticking problem are difficult to discern. A discussion of causes of "stiction" is set out in an article entitled "The Effect of Release-Etch Processing on Surface Microstructure Stiction" by Alley, Cuan, Howe, and Komvopoulos in *Proceedings of the IEEE Solid State Sensor and Actuator Workshop* (1992) pp. 202–207. Various causes of stiction that are discussed are solid bridging, liquid bridging, Van de Waals forces, electrostatic forces, and surface roughness.

Many attempts to solve the sticking problem have been directed to overcoming assumed adhesion forces by coating contacting surfaces with various substances, such as lubricants, during fabrication. However, these techniques are preventative rather than curative, and do not solve the problem of unsticking contacting elements once they have become stuck.

Supercritical fluids have been recognized as a means for drying micro-mechanical devices which have been rinsed in liquids, as part of their fabrication, resulting in stuck elements. A discussion of ameliorating liquid bridging by critical point (SCF) drying is set out in an article entitled "Supercritical Carbon Dioxide Drying of Microstructures" by Mulhern, Soane, and Howe in 7th International Conference on Solid State Sensors and Actuators(1993) pp. 296–299. However, these techniques are limited to post-rinse drying during fabrication.

SUMMARY OF THE INVENTION

One aspect of the invention is a method of unsticking of contacting elements of a micro-mechanical device. The device is placed in a liquid container and its contacting elements are immersed in a low surface tension liquid containing a surfactant. Then, the container is enclosed, and the device is dried in a manner that substantially preserves pressure equilibrium between the low surface tension liquid and its vapor phase. The low surface tension liquid may be a fluorocarbon liquid, such as a perfluorinated alkane. Alternatively, instead of being immersed in a low surface tension liquid, the contacting elements may be exposed to a supercritical fluid, which has zero surface tension.

A technical advantage of the invention is that it unsticks stuck components without damaging them. Various embodiments of the invention remove residue that might have contributed to the sticking, and thus prevent the sticking from recurring. The method can be performed on the micro-mechanical device as a finishing step near the end of its fabrication process, or it can be performed after the device is finished and has been in operation.

DETAILED DESCRIPTION OF THE INVENTION

For purpose of example, the following description is in terms of a particular type of micro-mechanical device, a "digital micro-mirror device" (DMD), sometimes also referred to as a "deformable mirror device". A DMD is a type of spatial light modulator. The DMD has one or more tiny mirrors, which are selectively deflectable so as to reflect or not reflect light to a desired location. The method of the invention cures sticking of the mirrors to a "landing pad", which they touch when they fully deflect.

One application of DMDs is for forming images, where the DMD has an array of hundreds or thousands of deflectable mirrors. Each mirror selectively reflects light to an image plane. The images formed by the DMD can be used in display systems or for non-impact printing applications. Other applications of DMD's are possible that do not involve image formation, such as optical steering, optical switching, and accelerometers. In some of these applications, the "mirror" need not be reflective. Also, in some applications, the DMD is operated in an analog rather than digital mode. In general, the term "DMD" is used herein to include any type of micro-mechanical device having at least one hinge-mounted element that contacts a landing surface in response to an applied voltage or other force such as that caused by acceleration in the case of an accelerometer.

The invention is useful for other types of micro-mechanical devices that have contacting elements. Like the DMD's mirrors, other micro-mechanical devices may have tiny rotors, levers, or other moving parts that contact with another surface and become stuck.

Figure 1:
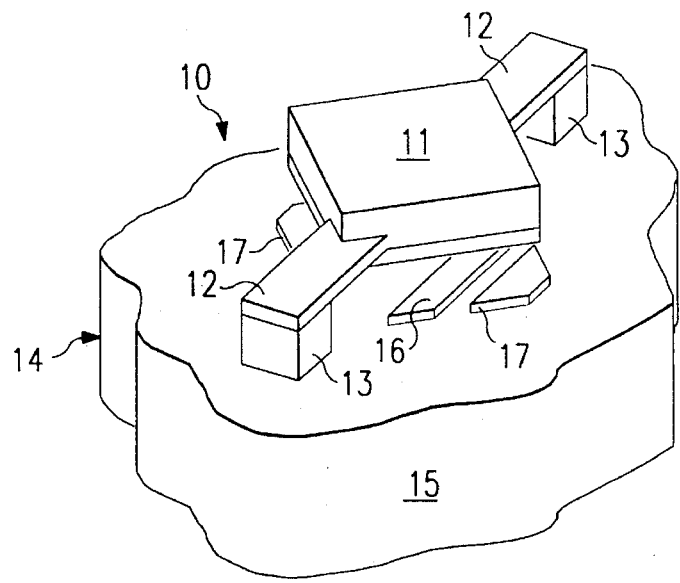
FIG. 1 illustrates an undeflected mirror element of one type of micro-mechanical device, a digital micro-mirror device (DMD), having contacting elements.
Figure 2:
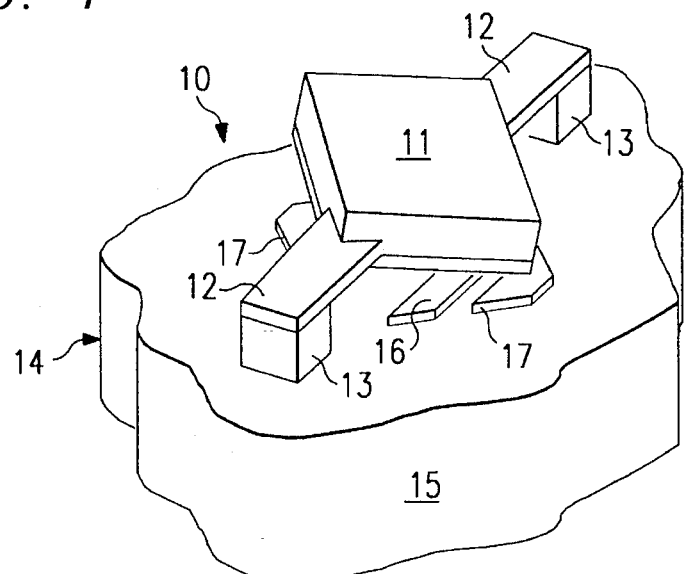
FIG. 2 illustrates the mirror element of FIG. 1 in a deflected position.

FIGS. 1 and 2 illustrate a single mirror element 10 of a DMD. In FIG. 1, the mirror element 10 is in a flat (undeflected) state, whereas in FIG. 2, the mirror element 10 is deflected. As stated above, various DMD applications may use such mirror elements 10 singly or in arrays.

The mirror element 10 of FIGS. 1 and 2 is known as a "torsion beam" element. Other types of mirror elements 10 can be fabricated, including cantilever beam types and flexure beam types. Various DMD types are described in U.S. Pat. No. 4,662,746, entitled "Spatial Light Modulator and Method"; U.S. Pat. No. 4,956,610, entitled "Spatial Light Modulator"; U.S. Pat. No. 5,061,049 entitled "Spatial Light Modulator and Method"; U.S. Pat. No. 5,083,857 entitled "Multi-level Deformable Mirror Device"; and U.S. patent Ser. No. 08/097,824. Each of these patents is assigned to Texas Instruments Incorporated and each is incorporated herein by reference.

In operation for image display applications, a light source illuminates the surface of the DMD. A lens system may be used to shape the light to approximately the size of the array of mirror elements 10 and to direct this light toward them. Each mirror element 10 has a tilting mirror 11 supported by torsion hinges 12 attached to support posts 13. These support posts 13 are formed on and extend away from the substrate 15. The mirrors 11 are positioned over a control circuit 14, which is comprised of address and memory circuitry and fabricated on the substrate 15.

Voltages based on data in the memory cells of control circuit 14 are applied to two address electrodes 16, which are located under opposing corners of mirror 11. Electrostatic forces between the mirrors 11 and their address electrodes 16 are produced by selective application of voltages to the address electrodes 16. The electrostatic force causes each mirror 11 to tilt either about +10 degrees (on) or about −10 degrees (off), thereby modulating the light incident on the surface of the DMD. Light reflected from the "on" mirrors 11 is directed to an image plane, via display optics. Light from the "off" mirrors is reflected away from the image plane. The resulting pattern forms an image. The proportion of time during each image frame that a mirror 11 is in the "on" position determines shades of grey. Color can be added by means of a color wheel or by a three-DMD setup.

In effect, the mirror 11 and its address electrodes 16 form capacitors. When appropriate voltages are applied to the mirror 11 and to the address electrodes 16, the resulting electrostatic force (attracting or repelling) causes the mirror 11 to tilt toward the landing electrode 17 associated with the attracting address electrode 16. The mirror 11 tilts until its edge contacts the landing electrode 17.

Once the electrostatic force between the address electrodes 16 and the mirror 11 is removed, the energy stored in the hinge 12 provides a restoring force to return the mirror 11 to its undeflected position. Appropriate voltages may be applied to the mirror 11 or address electrodes 16 to aid in returning the mirror 11 to its undeflected position. However, if a mirror 11 has become stuck, these forces may not be sufficient to overcome the sticking force.

Figure 3:
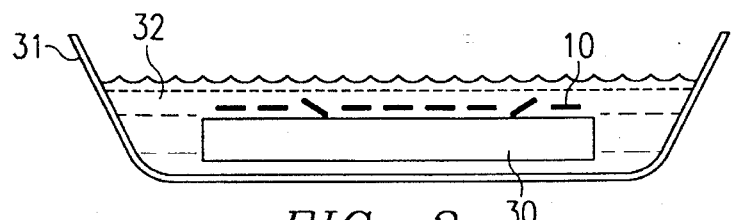
FIGS. 3–5 illustrate a method of treating stuck components of a micro-mechanical device in accordance with the invention.
Figure 4:
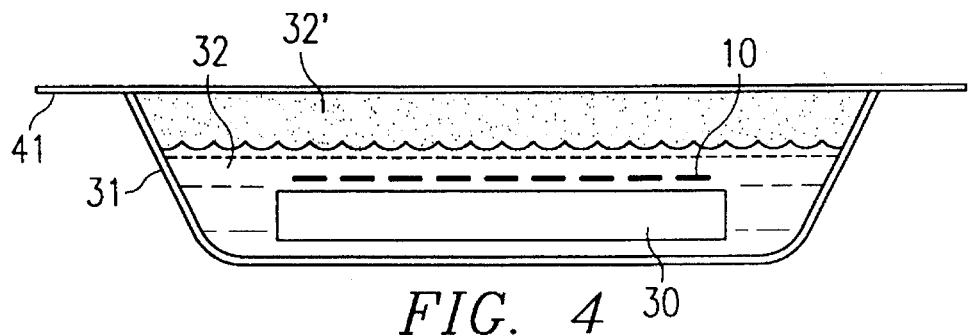
Figure 5:
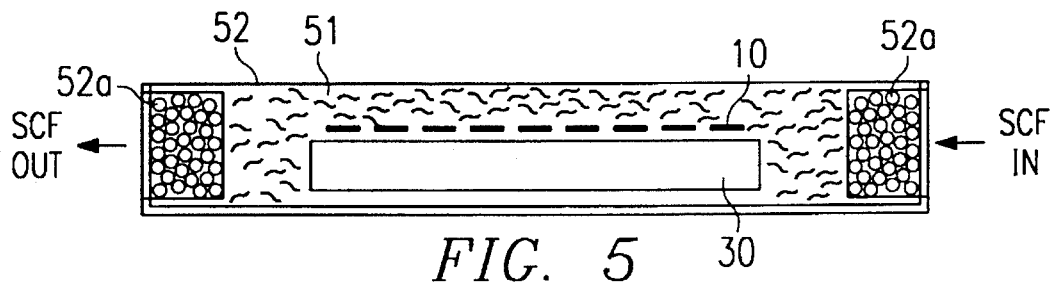
Figure 6:
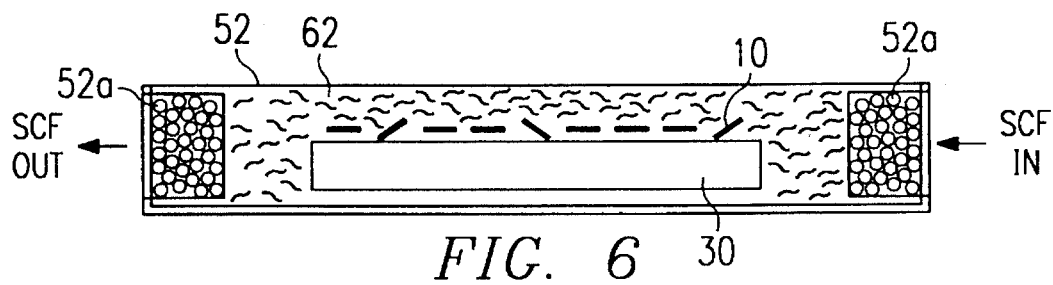
FIG. 6 illustrates an alternative to the step of FIG. 3.

FIGS. 3-5 illustrate a method of treating a micro-mechanical device whose contacting elements are stuck, using a low surface tension liquid in accordance with the invention. FIG. 6 illustrates an alternative to the step illustrated in FIG. 3, using a supercritical fluid rather than a low surface tension liquid.

As stated above, for purposes of example, a DMD micromechanical device is illustrated, but the same process may be performed on any micro-mechanical device. The method is performed on a device that is at least substantially finished. The method can be performed as a "back-end" fabrication step on a device whose micro-mechanical components have become stuck during a prior fabrication step. For example, the method may be performed during fabrication of a wafer that is to be eventually separated into chips, each having a DMD array. This method is well suited for volume production of this type, and is easily integrated into the process flow for making DMDs or other micro-mechanical devices. Alternately, the method can be performed as a maintenance treatment on a device that has already been in operation for some time.

In FIG. 3, a DMD 30 has been at least substantially fabricated, including the landing electrodes 17, address electrodes 16, and mirrors 11 of each mirror element 10. Typically, the fabrication of these components involves the use of a temporary spacer material, which has been removed in FIG. 3. As indicated, at least some of the mirror elements 10 have become stuck in a deflected position.

The DMD 30 is placed in a container 31 suitable for holding liquids, and immersed in a low surface tension liquid 32 that contains a surface active agent (surfactant). Examples of suitable low surface tension liquids 31 are fluorocarbon liquids, especially perfluorinated alkanes. One such suitable liquid is "FC-77", a mixture of perfluorinated alkanes, commercially available from 3M Corporation. An example of a suitable liquid with a surfactant is a 0.2% non-ionic surfactant in perfluoro-n-methyl morpholine. A commercially available liquid that contains a perfluorinated alkane with a surfactant, known as "PF-5052" and available from 3M Corporation, has been used successfully.

FIG. 4 illustrates a drying step, performed after the immersion step of FIG. 3. In the example of FIG. 4, the drying is a vacuum drying. A cover 41 has been placed over the container 31, or container 31 is otherwise enclosed, so as to retain the vapors 32' from liquid 32 as the liquid 32 dries, instead of exposing the device 30 directly to a vacuum. The vacuum is controlled so that as the liquid is drawn from the container 31, the liquid 32 is in pressure equilibrium with its vapor 32'.

FIG. 5 illustrates a third step, which may be performed after the immersion and drying steps of FIGS. 3 and 4. In FIG. 5, the device 30 is cleaned to remove any residue of surfactant that may remain on its surfaces. The cleaning step of FIG. 5 may be accomplished in a number of different ways. The step illustrated is accomplished by exposing the device 30 to a supercritical fluid 51, with or without an additive, such that any residue is solubilized. For example, a supercritical carbon dioxide/acetone binary fluid has been experimentally found satisfactory.

As indicated in FIG. 5, because of the gas-like diffusion behavior of a supercritical fluid, the DMD 30 is placed in a container 52 having baffled entry and exit ports 52a. These ports 52a eliminate any damage to the mirror elements 10 that might occur as a result of gas turbulence when the supercritical fluid 52 enters and exits. An example of a suitable baffle 52a is densely packed beads. However, various other diffusive material could be used. The remainder of container 52 is made from a material suitable for containing high pressure fluid, such as stainless steel.

Another suitable treatment to remove surfactant residue would be a thermal treatment. This would be the case for certain surfactants that become volatile at temperatures greater than ambient temperatures, but less than a temperature that might cause damage to the device. The heating would be accompanied by drying to help remove the residue.

The cleaning step of FIG. 5 is amenable to alterations in the physically and chemical processing parameters so as to permit selective extraction of residues. For example, in the case of a DMD, residues other than that from photoresist may result in a greater need for extraction.

FIG. 6 illustrates an alternative means of accomplishing the immersion step of FIG. 3. In FIG. 6, the DMD 30 is exposed to a supercritical fluid 62, which may or may not contain a surfactant. As compared to the supercritical fluid drying discussed in the Background, the exposure is to a DMD 30 that is "dry" in the sense that it has not been rinsed or otherwise immersed in liquid immediately prior to the supercritical fluid exposure. The sticking that the invention eliminates could come from causes other than by being immersed in a liquid. An example of a suitable supercritical fluid 62 is carbon dioxide. The supercritical fluid could be a binary fluid, such as one composed of carbon dioxide and ethanol or of carbon dioxide and acetone. An example of a suitable supercritical fluid 62 with a surfactant is one comprised of carbon dioxide and a non-ionic surfactant such as that contained in PF-5052. As described above in connection with FIG. 5, a special container 52 is used for entry and exit of the supercritical fluid.

Certain conditions of pressure, temperature, and fluid flow may be determined for optimum results. Experimental testing with DMD devices 30 has indicated that a carbon dioxide supercritical fluid 62 at a pressure of 500 atmospheres within a range of 35 degrees to 80 degrees centigrade, at a flow rate of 400 sccm will provide good results. Exposure times were of 30 minutes. For the same supercritical fluid, results were less satisfactory for exposure time of 2 hours at a flow rate of 22 liters per hour at 80 degrees centigrade and 500 atmospheres. After exposure for an appropriate time, the pressure release is controlled such that evacuation of the fluid to ambient pressure occurs over time, thereby avoiding damage to the device.

If the supercritical fluid 62 contains a surfactant, the DMD 30 may be further treated, as described above in connection with FIG. 5, to remove any residue of the surfactant.

The above-described method results in unsticking the mirror elements 10 of a DMD 30, or, more generally, the contacting elements of a micro-mechanical device. In contrast, supercritical fluids may also be used as part of a cleaning and treating process to prevent sticking of contacting elements of a micromechanical device.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of unsticking of contacting elements of a micro-mechanical device which has been at least substantially fabricated comprising the steps of:

immersing said contacting elements in a body of a low surface tension liquid containing a surfactant, after said contacting elements have become stuck; and drying said device so that pressure equilibrium between said low surface tension liquid and its vapor phase is substantially preserved.

2. The method of claim 1, wherein said low surface tension liquid is a fluorocarbon liquid.

3. The method of claim 2, wherein said fluorocarbon liquid is perfluorinated alkane.

4. The method of claim 1, wherein said low surface tension liquid is perfluoro-n-methyl morpholine.

5. The method of claim 1, wherein said surfactant is a non-ionic surfactant.

6. The method of claim 1, wherein said drying is vacuum drying.

7. The method of claim 1, further comprising a step of removing residue of said surfactant from said device after said drying.

8. The method of claim 7, wherein said step of removing is performed with a supercritical fluid such that said residue is solubilized.

9. The method of claim 8, wherein said supercritical fluid is a carbon dioxide/acetone binary fluid.

10. The method of claim 7, wherein said step of removing is performed with a thermal treatment such that said residue is volatilized.

11. A method of unsticking dry contacting elements of a micromechanical device which has been at least substantially fabricated comprising the step of:

exposing said containing elements to a supercritical fluid, after said contacting elements have become stuck.

12. The method of claim 11, wherein said exposing is performed by placing said device in a container having baffled entry and exit ports.

13. The method of claim 11, wherein said exposing is under high pressure conditions with a controlled pressure release after said exposing.

14. The method of claim 11, wherein said supercritical fluid is carbon dioxide.

15. The method of claim 11, wherein said supercritical fluid is a carbon dioxide/acetone binary fluid.

16. The method of claim 11, wherein said supercritical fluid is a carbon dioxide/ethanol binary fluid.

17. The method of claim 11, wherein said exposing is performed at a temperature between 35 and 80 degrees centigrade.

18. The method of claim 11, wherein said exposing is performed at a pressure of approximately 500 atmospheres.

19. The method of claim 11, wherein said supercritical fluid contains a surfactant.

20. The method of claim 11, wherein said supercritical fluid contains a surfactant and further comprising a step of removing said surfactant from said device after said exposing.

\* \* \* \* \*